United States Patent
Simizu

(10) Patent No.: US 6,608,313 B2
(45) Date of Patent: Aug. 19, 2003

(54) METHODS AND DEVICES FOR ACHIEVING ALIGNMENT OF A BEAM-PROPAGATION AXIS WITH A CENTER OF AN APERTURE IN A CHARGED-PARTICLE-BEAM OPTICAL SYSTEM

(75) Inventor: Hiroyasu Simizu, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 206 days.

(21) Appl. No.: 09/765,530

(22) Filed: Jan. 19, 2001

(65) Prior Publication Data

US 2001/0010362 A1 Aug. 2, 2001

(51) Int. Cl.⁷ ............................................... H01J 37/304
(52) U.S. Cl. ................ 250/397; 250/491.1; 250/492.21
(58) Field of Search ........................... 250/397, 492.21, 250/492.2, 398, 491.1

(56) References Cited

U.S. PATENT DOCUMENTS

| | | | | |
|---|---|---|---|---|
| 3,745,358 A | * | 7/1973 | Firtz et al. ................ | 250/492.2 |
| 4,524,277 A | * | 6/1985 | Shimura et al. ............ | 250/397 |
| 4,939,371 A | * | 7/1990 | Goto ......................... | 250/397 |
| 5,391,886 A | * | 2/1995 | Yamada et al. ........ | 250/492.22 |
| 2001/0016294 A1 | * | 8/2001 | Yahiro ......................... | 430/30 |
| 2002/0008209 A1 | * | 1/2002 | Simizu ....................... | 250/247 |

FOREIGN PATENT DOCUMENTS

| | | |
|---|---|---|
| JP | 11-297610 | 10/1999 |
| JP | 2000-012454 | 1/2000 |
| JP | 2000-100691 | 4/2000 |

* cited by examiner

*Primary Examiner*—Bruce Anderson
(74) *Attorney, Agent, or Firm*—Klarquist Sparkman LLP

(57) ABSTRACT

Methods and devices are disclosed for aligning a beam-propagation axis with the center of an aperture, especially an aperture configured to limit the aperture angle of the charged particle beam. In an exemplary method, an alignment-measurement aperture is provided at an imaging plane of a charged-particle-beam (CPB) optical system, and a beam detector is downstream of the alignment-measurement aperture. A scanning deflector is energized to cause the beam to be scanned in two dimensions, transverse to an optical axis, over the aperture. Meanwhile, the beam detector obtains an image of beam intensity in the two dimensions. In the image a maximum-intensity point is identified, corresponding to the propagation axis. Based on the two-dimensional image, the beam is deflected as required to align the propagation axis with the aperture center.

9 Claims, 3 Drawing Sheets

METHODS AND DEVICES FOR ACHIEVING ALIGNMENT OF A BEAM-PROPAGATION AXIS WITH A CENTER OF AN APERTURE IN A CHARGED-PARTICLE-BEAM OPTICAL SYSTEM

FIELD OF THE INVENTION

This invention pertains to, *inter alia*, charged-particle-beam (CPB) optical systems as used in CPB microlithography. (Microlithography is projection-transfer of a pattern, defined by a reticle or mask, onto a sensitive substrate using an energy beam. Microlithography is a key technique used in the manufacture of microelectronic devices such as semiconductor integrated circuits, displays, and the like.) CPB optical systems typically include various CPB lenses, deflectors, and apertures. More specifically, the invention pertains to devices and methods for aligning an aperture-angle-limiting aperture with an optical axis of the CPB optical system.

BACKGROUND OF THE INVENTION

Charged-particle-beam (CPB) microlithography is a candidate new-generation microlithography technique offering prospects of better image resolution than currently obtainable with optical microlithography. A CPB microlithography apparatus includes a CPB optical system and a CPB source. The CPB source produces a suitable charged particle beam, such as an electron beam or ion beam, for use as a microlithographic energy beam. The CPB optical system typically includes CPB lenses, deflectors, and apertures. One type of aperture limits the angle at which charged particles are incident on the reticle or substrate, and hence is termed herein an "aperture-angle-limiting aperture."

A conventional CPB optical system as used in a conventional CPB microlithography system is shown in FIG. 3. The FIG. 3 system is shown and described in the context of forming and using an electron beam as a representative charged particle beam, and in the context of employing a reticle defining a pattern that is projected onto a sensitive substrate.

The FIG. 3 system includes a source 1, an illumination-optical system IOS, and a projection-optical system POS. The source 1 produces an electron beam 3 that propagates in a downstream direction. The illumination-optical system IOS comprises components situated downstream of the source 1 and upstream of a reticle 9. The projection-optical system POS comprises components situated downstream of the reticle 9 and upstream of a sensitive substrate (or "wafer") 12. By "sensitive" is meant that the upstream-facing surface 12s of the substrate 12 is coated with a suitable material (termed a "resist") that responds in an image-imprinting way to exposure by the charged particle beam. Exposure of the resist with an image of a region (e.g., a "subfield") of the reticle 9 causes "transfer" of an image of the respective pattern portion to the upstream-facing surface 12s. Extending through the illumination-optical system IOS and projection-optical system POS is an optical axis A.

The electron beam 3 emitted from a cathode of the source 1 forms a beam crossover 2 on the optical axis A. The beam 3 propagating downstream of the beam crossover 2 is an "illumination beam" that passes through a first illumination lens 4. The first illumination lens 4 forms an image of the cathode on a beam-shaping aperture 5 (defining typically a rectangular opening 5a). The beam-shaping aperture 5 trims the transverse profile of the illumination beam, according to the profile of the opening 5a, as appropriate for illuminating the desired shape and size of individual subfields or other exposure units on the reticle. Meanwhile, the first illumination lens 4 forms an image of the beam crossover 2 on an aperture-angle-limiting aperture 7. A maximal aperture angle of the beam 3 (as incident on the upstream-facing surface 12s located in the imaging plane) is imposed on the beam by the aperture-angle-limiting aperture 7.

After establishing the desired transverse dimensions of individual exposed subfields and the desired range of the aperture angle, as described above, an image of the cathode is formed on the reticle 9 by a second illumination lens 8. Portions of the illumination beam passing through a selected subfield on the reticle 9 constitute a "patterned beam" that forms an image of the illuminated subfield on the upstream-facing surface 12s of the substrate ("wafer") 12. Actual imaging is performed by a first projection lens 10 and a second projection lens 11 of the projection-optical system POS.

The reticle 9 defines the pattern to be exposed. In one type of conventional reticle 9 (termed a "stencil" reticle), openings are defined in a thin film or membrane (made of a silicon membrane or the like). The openings versus surrounding regions in the thin film define the pattern elements (i.e., the openings are transmissive to charged particles of the illumination beam and the membrane tends to block incident charged particles). In another type of conventional reticle 9, termed a "scattering-membrane" reticle, pattern elements are defined by corresponding regions of a heavy-metal layer (that exhibits a high level of scattering of incident charged particles) situated on a CPB-transmissive membrane.

With a stencil reticle, as noted above, incident charged particles of the illumination beam not passing through an opening tend to be blocked (and absorbed) by the membrane portion of the reticle 9. This absorption causes membrane heating, especially if the membrane is thick, which results in reticle instability. Consequently, the reticle membrane usually is made sufficiently thin to transmit (with scattering) at least some of the incident charged particles. Since incident charged particles are scattered widely by such a membrane (but not by the openings in the membrane), an aperture normally is situated downstream of the reticle 9 to absorb the scattered electrons and thus prevent them from propagating to the substrate. By absorbing these scattered charged particles, appropriate contrast is obtained of the image as formed on the substrate 12.

In a conventional CPB microlithography apparatus, the center of the aperture-angle-limiting aperture 7 is located on the optical axis A. It is desirable that the propagation axis of the illumination beam be aligned with the optical axis A at the aperture-angle-limiting aperture 7. Significant misalignment causes the distribution of beam angle on the substrate to be asymmetric, which causes substantial aberration of an image as projected onto the upstream-facing surface 12s.

To avoid or minimize Coulomb effects, a recent innovation is to configure the aperture-angle-limiting aperture 7 as an annular aperture, which produces a "hollow" illumination beam. In this regard, reference is made to Japan *Kôkai* Patent Document Nos. 11-297610, filed Apr. 8, 1998, 2000-012454, filed Jun. 25, 1998, and 2000-100691, filed Sep. 21, 1998. With an annular aperture-angle-limiting aperture, misalignment of the propagation axis of the illumination beam, the optical axis A, and the center of the aperture-angle-limiting aperture 7 with each other causes marked asymmetry in the transverse distribution of beam current. Such asymmetry of beam-current density causes, in turn, a corresponding asymmetry of the Coulomb effect, making controlled reductions of the Coulomb effect especially difficult. These problems cause substantial problems with aberrations.

In FIG. 3, a deflector 6 normally is used to align the propagation axis of the illumination beam with the center of the aperture-angle-limiting aperture 7. To such end, the deflection center of the deflector 6 normally is set to the position of the beam-shaping aperture 5 to prevent the image of the beam-shaping aperture 5 from shifting laterally as the deflector 6 is energized. By energizing the deflector 6, the illumination beam is shifted laterally relative to the aperture-angle-limiting aperture 7. While energizing the deflector 6, the beam current incident to the aperture-angle-limiting aperture 7 is read using an ammeter 17. The propagation axis of the illumination beam is regarded as aligned with the center of the aperture-angle-limiting aperture 7 whenever the measured current is at a minimum, indicating completion of alignment.

Unfortunately, in the alignment method summarized above, the current reading obtained by the ammeter 17 is extremely small in any event. Consequently, the current reading at "alignment" can be at a level that is barely detectable. Furthermore, the ammeter 17 tends to exhibit very low sensitivity at any of various locations around the actual "aligned" position. I.e., the ammeter 17 reads an integrated current from all locations on the aperture-angle-limiting aperture 7 at which the beam is incident, making it extremely difficult to ascertain any difference in a reading at an actual "aligned" position versus a position characterized by substantial misalignment. As a result, it is extremely difficult to accurately determine whether the propagation axis of the beam has been aligned properly. I.e., even though it is possible to align the propagation axis of the illumination beam with the center of the aperture-angle-limiting aperture 7, it actually is extremely difficult to do so using the conventional approaches summarized above.

SUMMARY OF THE INVENTION

In view of the shortcomings of conventional methods and apparatus as summarized above, one object of the invention is to provide charged-particle-beam (CPB) optical systems, and CPB microlithography apparatus (including CPB point-beam writing apparatus and CPB projection-microlithography apparatus) comprising such optical systems, wherein the systems and apparatus exhibit reduced aberrations compared to conventional apparatus. Another object is to provide methods for accurately aligning the propagation axis of a CPB illumination beam with the center of an aperture-angle-limiting aperture.

To such ends, and according to a first aspect of the invention, methods are provided, in the context of, for example, a CPB microlithography method, for aligning the propagation axis of an imaging beam with a center of an aperture-angle-limiting aperture. In the subject CPB microlithography method, a charged-particle illumination beam, propagating from a beam source and having a respective propagation axis, is passed through an illumination-optical system that includes a lens, a deflector, and an aperture-angle-limiting aperture. In the alignment method, the following are provided: (1) a projection-optical system that forms an image of the aperture-angle-limiting aperture at an imaging plane, (2) an alignment-measurement aperture situated at the imaging plane, (3) a beam detector situated downstream of the alignment-measurement aperture, and (4) a scanning deflector, situated upstream of the alignment-measurement aperture, configured to impart a deflection in two dimensions to an imaging beam formed of a portion of the illumination beam passing through the aperture-angle-limiting aperture and having a propagation axis. The deflection is transverse to the propagation axis of the imaging beam. The scanning deflector is energized so as to cause the imaging beam to be deflected in the two dimensions over the alignment-measurement aperture, while using the beam detector to obtain an image of beam intensity of the imaging beam passing through the alignment-measurement aperture, as distributed over the two dimensions. In the image of beam intensity a point of maximum intensity, corresponding to the propagation axis of the imaging beam, is identified. Based on the two-dimensional image, the deflector in the illumination-optical system is energized as required to align the propagation axis of the imaging beam with the center of the aperture-angle-limiting aperture.

The method can include the step of determining the center of gravity of the aperture-angle-limiting aperture, wherein the center of gravity corresponds to the center of the aperture-angle-limiting aperture. The step of determining the center of gravity of the aperture-angle-limiting aperture can include the steps of: (1) converting the two-dimensional image to a binary image of the aperture-angle-limiting aperture, and (2) from the binary image, determining the center of gravity of the aperture-angle-limiting aperture.

The method can include the step of smoothing the two-dimensional intensity distribution, wherein the point of maximum intensity is identified based on the smoothed distribution.

According to another aspect of the invention, CPB optical systems are provided. An embodiment of such a system comprises an illumination-optical system situated along an optical axis and including an illumination lens, a deflector, and an aperture-angle-limiting aperture. The illumination-optical system is transmissive to an illumination beam propagating from a beam source. The system also comprises a projection-optical system situated along the optical axis downstream of the illumination-optical system. The projection-optical system includes a projection lens and is transmissive to an imaging beam propagating along a propagation axis from the illumination-optical system. The system also includes a beam-alignment device configured to determine a condition of alignment of the propagation axis of the imaging beam with a center of the aperture-angle-limiting aperture. The beam-alignment device comprises: (1) an alignment-measurement aperture situated at an imaging plane; (2) a beam detector situated downstream of the alignment-measurement aperture; (3) a scanning deflector situated upstream of the alignment-measurement aperture, the scanning deflector being configured to deflect the imaging beam in two dimensions, perpendicular to the optical axis, over the alignment-measurement aperture; and (4) a controller connected to the beam detector and the scanning deflector. The controller is configured to (a) energize the scanning deflector so as to deflect the imaging beam (carrying an image of the aperture-angle-limiting aperture) in the two dimensions over the alignment-measurement aperture on the imaging plane, (b) obtain a signal from the beam detector corresponding to a two-dimensional image of intensity of the imaging beam passing through the alignment-measurement aperture, (c) identify a point of maximum intensity corresponding to the propagation axis, and (d) based on the two-dimensional image, energize the deflector in the illumination-optical system as required to align the propagation axis with the center of the aperture-angle-limiting aperture.

According to another aspect of the invention, CPB microlithography apparatus are provided that comprise a CPB optical system as summarized above. The CPB microlithography apparatus are not limited to "projection-microlithography" apparatus. Also encompassed are any of various other types of CPB microlithography apparatus, such as CPB point-beam writing apparatus.

The foregoing and additional features and advantages of the invention will be more readily apparent from the following detailed description, which proceeds with reference to the accompanying drawings.

DETAILED DESCRIPTION

This invention is described below in the context of a representative embodiment, which is not intended to be limiting in any way. The representative embodiment is described in the context of utilizing an electron beam as the microlithography energy beam. However, it will be understood that any of various other charged particle beams can be used with equal facility, such as an ion beam. The representative embodiment also is described in the context of employing a reticle defining a pattern that is projected onto a sensitive substrate. It will be understood, however, that any of various other types of CPB optical systems and microlithography apparatus (that do not utilize a reticle), such as CPB point-beam writing apparatus, alternatively can be employed.

Figure 1:
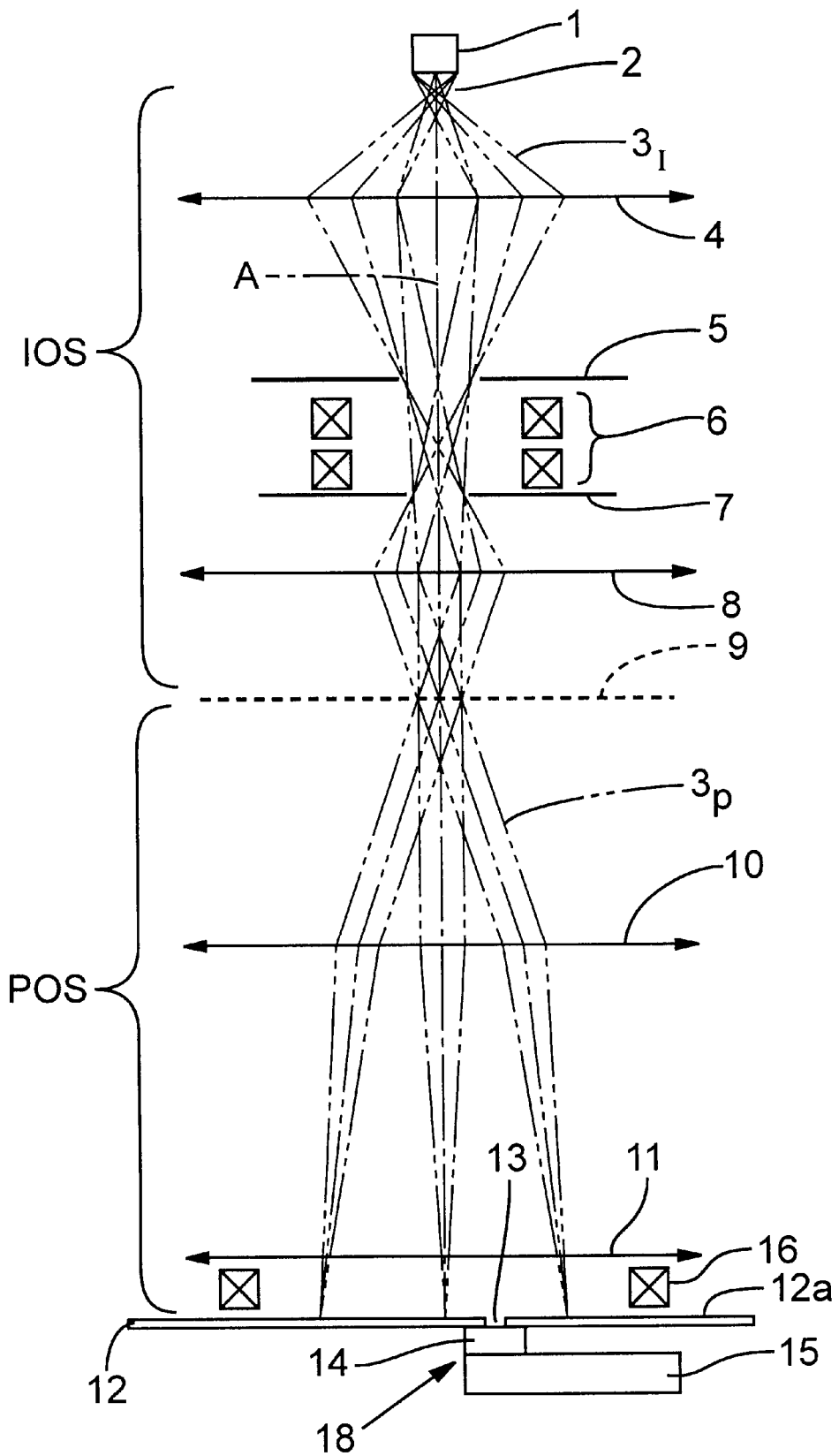
FIG. 1 is a schematic optical diagram of a charged-particle-beam (CPB) microlithography apparatus, including a CPB optical system, according to a representative embodiment of the invention.
Figure 3:
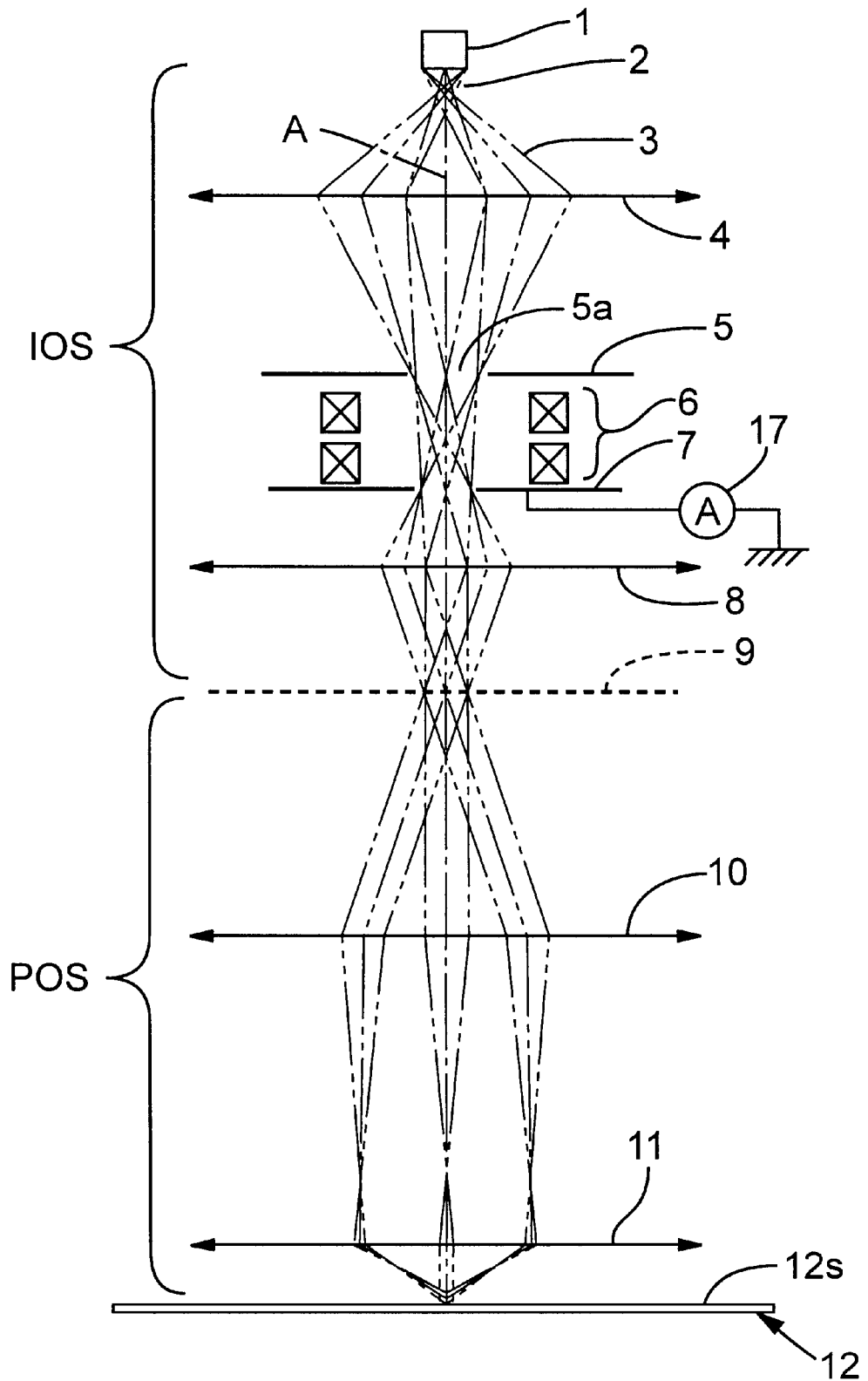
FIG. 3 is a schematic optical diagram of a conventional CPB microlithography apparatus configured to perform an alignment, using conventional methods, of the propagation axis of the illumination beam with the center of an aperture-angle-limiting aperture.

Reference is made to FIG. 1 that schematically depicts an electron-beam projection-microlithography apparatus, and electron-beam optical system, according to the representative embodiment. In FIG. 1, components that are similar to corresponding components shown in FIG. 3 have the same respective reference numerals and are not described further. These similar components are the source 1 (e.g., electron gun with cathode electron-emitting surface), the crossover 2, the first illumination lens 4, the beam-shaping aperture 5, the deflector 6, the aperture-angle-limiting aperture 7, the second illumination lens 8, the reticle 9, the first projection lens 10, the second projection lens 11, and the substrate 12. The electron beam as emitted by the source 1 is termed the "illumination beam" $3_I$, which becomes the "imaging beam" $3_P$ after passing through the reticle 9. The FIG. 1 apparatus also includes an imaging-optical system IOS and a projection-optical system POS.

As is typical with CPB projection-microlithography, the reticle 9 defines a pattern that is divided into multiple portions generally termed "exposure units." An exemplary exposure unit is a "subfield" as understood in the art. In CPB projection-microlithography, rather than exposing the entire pattern, as defined on the reticle, in one "shot," the individual exposure units are exposed in an ordered manner onto respective regions of the substrate 12 so as to form an image of the complete pattern in which images of the individual exposure units are "stitched" together in a contiguous manner.

The FIG. 1 embodiment also includes an alignment-measurement device 18, described further below, that in this embodiment is located essentially at the substrate 12. The alignment-measurement device 18 comprises an alignment-measurement aperture 13 situated on the imaging surface 12a of the substrate 12. The imaging surface 12a constitutes an "imaging plane" of the projection-optical system POS. The alignment-measurement aperture 13 has a very small diameter but nevertheless is intended to transmit at least a portion of the imaging beam $3_P$. Downstream of the alignment-measurement aperture 13 is a scintillator 14 that produces light from impinging charged particles of the imaging beam $3_P$. Photons produced by the scintillator 14 are detected by a photomultiplier 15 or analogous detector. For scanning an image, carried by the imaging beam $3_P$, of the aperture-angle-limiting aperture 7 over the alignment-measurement aperture 13, a scanning deflector 16 is situated between the second projection lens 11 and the substrate 12.

The diameter of the alignment-measurement aperture 13 desirably is small compared to the size of the image of the aperture-angle-limiting aperture 7 on the alignment-measurement aperture 13. The smaller the diameter of the alignment-measurement aperture 13, the better the achievable locational resolution of the measurement, but the lower the detected beam current and signal-to-noise (S/N) ratio. Hence, the diameter of the alignment-measurement aperture 13 is dictated largely by an optimal balance of locational resolution and S/N ratio. An exemplary diameter is 10 $\mu$m, but this figure is not intended to be limiting in any way.

As the illumination beam $3_I$ propagates downstream of the source 1, the beam has a "beam axis" or "propagation axis" (not specifically shown but well understood in the art). With a Gaussian illumination beam $3_I$, the highest beam current in the transverse intensity profile of the beam normally is at the propagation axis of the beam. The illumination beam $3_I$ forms a beam crossover 2, desirably on the optical axis A just downstream of the source 1. An image of the cathode is formed on the beam-shaping aperture 5 by the first illumination lens 4. The beam-shaping aperture 5 typically defines a square or rectangular opening that trims the illumination beam $3_I$ passing through the beam-shaping aperture 5. Thus, the beam-shaping aperture 5 correspondingly defines, as the illumination beam $3_I$ passes through the opening, the transverse profile of the illumination beam $3_I$ as appropriate for illuminating the desired shape and size of exposure unit on the reticle 9.

Passage of the illumination beam $3_I$ through the first illumination lens 4 causes the illumination beam $3_I$ to form an image of the beam crossover 2 on the aperture-angle-limiting aperture 7. The aperture-angle-limiting aperture 7 limits the maximum aperture angle of the imaging beam $3_P$ as incident on the substrate 12 or at another suitable imaging plane of the projection-optical system POS. After establishing the desired transverse dimensions of the exposed subfields (or other exposure units) and the desired range of aperture angle, as described above, an image of the cathode is formed on the reticle 9 by the second illumination lens 8. Pattern resolution is determined largely by two factors. One is aberration, which increases with aperture angle. The other is the Coulomb effect, which decreases with aperture angle.

The desirable range of aperture angle (which normally is measured at the imaging plane) is determined by an optimum of these two factors. By way of example, in this embodiment, the aperture angle is 6 mrad at the wafer, but this specific angle is not intended to be limiting in any way. Alternatively to measuring the aperture angle at the imaging plane, the aperture angle can be measured at the object plane (reticle plane in some apparatus) because the object plane is conjugate with the imaging plane.

During microlithographic exposure, an image of the reticle 9 (the area of the image being limited by the beam-shaping aperture 5) is formed on the upstream-facing "sensitive" surface of the substrate 12 by the first projection lens 10 and second projection lens 12.

For performing an alignment of the propagation axis of the illumination beam $3_I$, a region of the reticle 9 is defined to transmit substantially the entire illumination beam $3_I$. Alternatively, the reticle 9 can be removed. Charged particles of the imaging beam $3_P$ are converged by the first projection lens 10 to form an image of the aperture-angle-limiting aperture 7 on an imaging surface 12a. The imaging surface 12a can be the upstream-facing surface of the substrate 12 or alternatively a region on a wafer stage (not shown but well understood in the art) to which the substrate 12 normally is mounted for exposure. For performing an adjustment of the propagation axis of the imaging beam $3_P$, the projection-optical system POS is adjusted so that an image of the aperture-angle-limiting aperture 7 is formed on the alignment-measurement aperture 13.

The portion of the imaging beam $3_P$ passing through the alignment-measurement aperture 13 is detected by the scintillator 14 and converted into a respective electrical current by the photomultiplier 15. A photomultiplier is especially suitable for this task because photomultipliers normally have a response time in nanoseconds and produce a signal gain of several thousand. Additional gain can be produced as required using a post-amplifier (not shown) connected to the photomultiplier 15. Hence, using the photomultiplier 15, it is possible to amplify the trace electrical current from the alignment-measurement aperture 13 rapidly. By using a combination of a scintillator 14 and a photomultiplier 15, the portion of the imaging beam $3_P$ passing through the alignment-measurement aperture 13 can be detected with excellent sensitivity and high responsiveness.

Meanwhile, the scanning deflector 16 deflects the imaging beam $3_P$ (carrying the image of the aperture-angle-limiting aperture 7) in a scanning manner over the alignment-measurement aperture 13. To such end, the scanning deflector 16 is actuated to scan the image of the aperture-angle-limiting aperture 7 two-dimensionally in the X- and Y-directions (the center axis of the projection-lens column is the Z-axis) on the imaging surface 12a (imaging plane) over the alignment-measurement aperture 13. If the instantaneous magnitude of image shift during such scanning is denoted (x,y), then the corresponding instantaneous intensity of the imaging beam $3_P$ detected by the alignment-measurement device 18 is denoted A(x,y). The function A(x,y) denotes the two-dimensional (in the X-Y plane) distribution of beam intensity, and is referred to herein as a "two-dimensional" image. The function A(x,y) corresponds to the electron-beam intensity distribution of the aperture-angle-limiting aperture 7 on the imaging plane.

In the foregoing description, the X-Y position of an image in two dimensions (X- and Y-dimensions) is determined by operation of the deflector 6 or other beam-scanning appliance. Hence, the distribution of beam intensity, formed after passage of the imaging beam $3_P$ through the alignment-measurement aperture 13, is two-dimensional on the imaging plane. In the two-dimensional image, the revealed location of greatest beam intensity corresponds to the location of the propagation axis of the imaging beam $3_P$. Also, because the outline of the two-dimensional image corresponds with the outline of the aperture-angle-limiting aperture 7, the center of the image corresponds to the center of the aperture-angle-limiting aperture 7. Hence, by adjusting the deflector 6 to cause the center of the two-dimensional image to be coincident with the location of peak beam intensity, the propagation axis of the beam is aligned accurately with the center of the aperture-angle-limiting aperture 7.

As used herein, "forming a two-dimensional image" is not limited to forming a visible image; it also encompasses forming a set of data that can be used in calculations for determining data otherwise obtainable from a two-dimensional image. Also, processing to determine the outline of a two-dimensional image or the like alternatively can be performed by processing actual data, rather than an image or plot.

By determining the two-dimensional distribution of beam intensity based on the intensity profile of the imaging beam $3_P$ after passage through the alignment-measurement aperture 13, the intensity distribution of the beam is determined with high accuracy and precision. Also, since the beam passing through the alignment-measurement aperture 13 is detected directly using a sensor, a better detection signal is obtained than otherwise would be obtained by, according to conventional practice, measuring beam current using an ammeter.

Figure 2A:
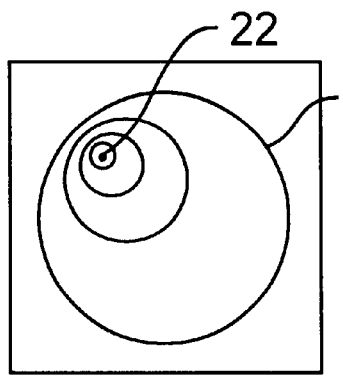
FIGS. 2(A)–2(E) schematically depict certain respective steps in a method, according to an aspect of the invention, for determining (from a two-dimensional image) a state of alignment of the propagation axis of the illumination beam with the center of an aperture-angle-limiting aperture, and for performing an alignment of the same.
Figure 2B:
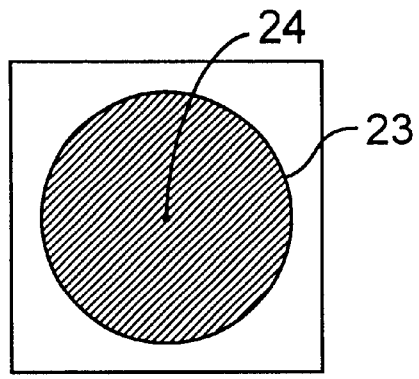
Figure 2C:
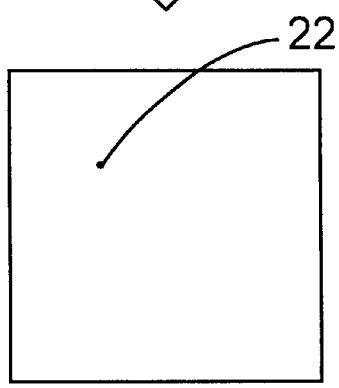
Figure 2D:
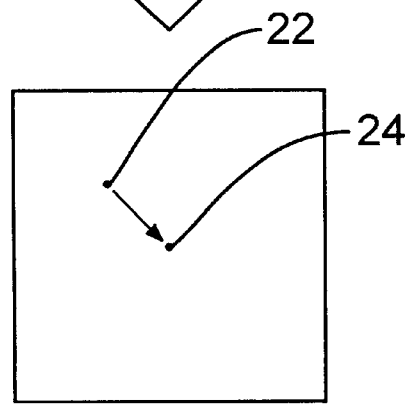
Figure 2E:
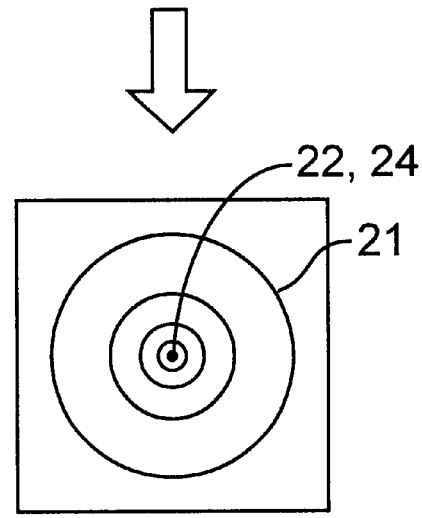

FIGS. 2(A)–2(E) schematically depict results of respective steps of a process in which the location of the propagation axis of the beam relative to the center of the aperture-angle-limiting aperture 7 is determined from the two-dimensional image A(x,y). Making such a determination allows the propagation axis of the imaging beam $3_I$ and the center of the aperture-angle-limiting aperture 7 to be aligned with each other. FIG. 2(A) depicts an exemplary initial (mis-aligned) beam-intensity distribution. The distribution is depicted as iso-intensity lines 21 situated relative to the propagation axis 22 of the beam. FIG. 2(B) depicts the results of converting the data of FIG. 2(A) into a respective binary image 23, in which the shaded region denotes regions in which the intensity exceeds a particular threshold. FIG. 2(C) shows the location of the propagation axis 22 of the beam, as determined from the initial beam-intensity distribution. FIG. 2(D) depicts shifting of the propagation axis 22 of the beam laterally so as to be coincident with the center 24 of the aperture-angle-limiting aperture 7. FIG. 2(E) depicts an aligned condition using iso-intensity lines 21. Item 24 is the location of the center of gravity of the binary image shown in FIG. 2(B).

In a first step (termed "image processing") of the alignment process, the two-dimensional image A(x,y) is spatially filtered as required to smooth the two-dimensional image A(x,y). The results of this step are shown in FIG. 2(A), in which the peak intensity is located at the position 22, corresponding to the propagation axis of the beam.

The two-dimensional distribution of beam intensity in the image A(x,y) actually detected exhibits more fluctuation with increased rate of scanning. Similarly, fluctuations decrease with a corresponding decrease in the scanning rate; this is because, at each measurement point, values are averaged over corresponding longer periods of time. Slower scanning rates are not desired because the time expended to perform an alignment is correspondingly longer. To alleviate the fluctuation phenomenon observed with faster scanning rates, the resulting two-dimensional distribution of beam intensity is "smoothed" to cancel or at least substantially reduce the fluctuations. The location at which beam intensity is greatest is determined using the smoothed data, and the determined location is used as the target position of the propagation axis of the beam. To achieve smoothing of the two-dimensional image, any of various known filter-processing techniques can be used such as any of those conventionally used for image processing. By using smoothed data, the location of the propagation axis of the beam can be determined quite accurately even in situations characterized by increased fluctuations in the intensity distribution due to increased scanning rates. Thus, the time required to perform beam-position alignment is decreased.

In a second step, intensity-distribution data, such as shown in FIG. 2(A), that exceed a specified threshold value are converted to a corresponding binary image. Since the intensity of the charged particle beam can be detected with high resolution, as described above, the image of the aperture-angle-limiting aperture 7 has a sharply outlined profile. This outline can be detected accurately by performing binary-conversion processing or differential processing of the image. By accurately detecting the outline of the aperture 7, its center of gravity can be determined readily using commonly known methods.

In this example, where the outermost iso-intensity line 21 in FIG. 2(A) represents a threshold, a nearly circular two-dimensional binary image 23 is formed such as shown in FIG. 2(B). In this step, since an image of the aperture-angle-limiting aperture 7 (which in this example is round) is formed on the imaging surface 12a, the intensity of the beam changes mostly around the circular edge of the image. Thus, the corresponding binary image in FIG. 2(B) appears as a round shaded disk. The location of a center of gravity 24 of the binary image can be regarded as the center of the aperture-angle-limiting aperture 7. Determining the center of gravity 24 from the two-dimensional binary image 23 can be performed using well-known methods, which can be applied with equal facility whether the binary image 23 is round or any other two-dimensional profile.

The location 22 at which beam intensity is greatest is determined from an intensity distribution such as that shown in FIG. 2(A). This location 22 is shown in FIG. 2(C). The deflector 6 is adjusted as appropriate to move the maximum-intensity position 22 (i.e., the propagation axis of the beam) to be coincident with the center of gravity 24 of the binary image 23 (i.e., the center of the aperture-angle-limiting aperture 7), as shown in FIG. 2(D). This adjustment is performed by calculating the separation distance, in the X- and Y-directions, between the maximum-intensity position 22 and the center of gravity 24. Then, respective currents are applied to the X-axis deflector and Y-axis deflector components of the deflector 6 to move the point 22 toward the point 24 (FIG. 2(D)). After making this adjustment, alignment measurements may be performed again as necessary. If misalignment still is evident, then further adjustments using the deflector 6 can be performed as required.

In the description above, converting the iso-intensity data to a corresponding binary image was performed as an easy way in which to determine the outline of an image of the aperture-angle-limiting aperture 7. Alternatively, this determination can be made by differential data processing. Also, whereas FIGS. 2(A)–2(E) schematically depict the results of respective processing steps, as described above, it will be understood that actual data processing in the method is performed by computer calculations and not by drawing figures.

Also, in the description above, the location (in the Z-direction) at which the image of the aperture-angle-limiting aperture 7 is formed is the imaging plane 12a, which normally is coplanar with the upstream-facing surface of the substrate 12 where an image of the reticle 9 is formed during microlithography. Such coincidence is achieved by adjusting the projection-optical system POS. However, it is not necessary that the image of the aperture-angle-limiting aperture 7 be formed at the imaging plane 12a using the projection-optical system POS. Alternatively, an image of the aperture-angle-limiting aperture 7 can be formed at any of various imaging planes using a separate dedicated lens system (not shown). However, by using the projection-optical system POS to form the image, the method described above does not require installation or utilization of any additional optical mechanisms other than a blanking aperture and the alignment-measurement device 18.

It is possible to store data concerning the adjustments of the deflector 6 as described above, and to recall the data later for use in a subsequent adjustment. Also, whereas it is possible to perform the alignment adjustments at set intervals, the amount of adjustment required alternatively can be estimated using a function incorporating the cumulative length of time in which the microlithography apparatus has been in continuous use, the beam intensity, etc., and the next adjustment performed when the misalignment exceeds a specified value.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method in which a charged-particle illumination beam, propagating from a beam source and having a respective propagation axis, is passed through an illumination-optical system that includes a lens, a deflector, and an aperture-angle-limiting aperture, a method for aligning the propagation axis of the illumination beam with a center of the aperture-angle-limiting aperture, the method comprising:

(a) providing a projection-optical system that forms an image of the aperture-angle-limiting aperture at an imaging plane;

(b) providing an alignment-measurement aperture situated at the imaging plane, and a beam detector situated downstream of the alignment-measurement aperture;

(c) providing a scanning deflector upstream of the alignment-measurement aperture, the scanning deflector being configured to impart a deflection in two dimensions to an imaging beam formed of a portion of the illumination beam passing through the aperture-angle-limiting aperture and having a propagation axis, the deflection being transverse to the propagation axis of the imaging beam;

(d) energizing the scanning deflector so as to cause the imaging beam to be deflected in the two dimensions over the alignment-measurement aperture, while using the beam detector to obtain an image of beam intensity of the imaging beam passing through the alignment-measurement aperture, as distributed over the two dimensions;

(e) in the image of beam intensity, identifying a point of maximum intensity corresponding to the propagation axis of the imaging beam; and (f) based on the two-dimensional image obtained in step (d), energizing the deflector in the illumination-optical system as required to align the propagation axis of the imaging beam with a center of the aperture-angle-limiting aperture.

2. The method of claim 1, including the step, before step (f), of determining the center of gravity of the aperture-angle-limiting aperture, the center of gravity corresponding to the center of the aperture-angle-limiting aperture.

3. The method of claim 2, wherein the step of determining the center of gravity of the aperture-angle-limiting aperture comprises:

converting the two-dimensional image to a binary image of the aperture-angle-limiting aperture; and from the binary image, determining the center of gravity of the aperture-angle-limiting aperture.

4. The method of claim 1, including the step, before step (e), of smoothing the two-dimensional intensity distribution obtained in step (d), wherein, in step (e), the point of maximum intensity is identified based on the smoothed distribution.

5. The method of claim 4, including the step, before step (f), of determining the center of gravity of the aperture-angle-limiting aperture, the center of gravity corresponding to the center of the aperture-angle-limiting aperture.

6. The method of claim 5, wherein the step of determining the center of gravity of the aperture-angle-limiting aperture comprises:

converting the two-dimensional image to a binary image of the aperture-angle-limiting aperture; and from the binary image, determining the center of gravity of the aperture-angle-limiting aperture.

7. A charged-particle-beam (CPB) optical system, comprising:

an illumination-optical system situated along an optical axis and including an illumination lens, a deflector, and an aperture-angle-limiting aperture, the illumination-optical system being transmissive to an illumination beam propagating from a beam source;

a projection-optical system, situated along the optical axis downstream of the illumination-optical system, the projection-optical system including a projection lens and being transmissive to an imaging beam propagating along a propagation axis from the illumination-optical system; and a beam-alignment device configured to determine a condition of alignment of the propagation axis of the imaging beam with a center of the aperture-angle-limiting aperture, the beam-alignment device comprising (a) an alignment-measurement aperture situated at an imaging plane;

(b) a beam detector situated downstream of the alignment-measurement aperture;

(c) a scanning deflector situated upstream of the alignment-measurement aperture, the scanning deflector being configured to deflect the imaging beam in two dimensions, perpendicular to the optical axis, over the alignment-measurement aperture; and (d) a controller connected to the beam detector and the scanning deflector, the controller being configured to (i) energize the scanning deflector so as to deflect the imaging beam in the two dimensions over the alignment-measurement aperture, (ii) obtain a signal from the beam detector corresponding to a two-dimensional image of intensity of the imaging beam passing through the alignment-measurement aperture, (iii) identify a point of maximum intensity corresponding to the propagation axis, and (iv) based on the two-dimensional image, energize the deflector in the illumination-optical system as required to align the propagation axis with the center of the aperture-angle-limiting aperture.

8. A CPB microlithography apparatus, comprising the CPB optical system of claim 7.

9. The CPB microlithography apparatus of claim 8, wherein the imaging plane is coplanar with a sensitive surface of a substrate situated downstream of the projection-optical system.

* * * * *